United States Patent
Han et al.

(10) Patent No.: US 10,892,737 B2
(45) Date of Patent: Jan. 12, 2021

(54) BULK-ACOUSTIC WAVE RESONATOR

(71) Applicant: Samsung Electro-Mechanics Co., Ltd., Suwon-si (KR)

(72) Inventors: Won Han, Suwon-si (KR); Tae Yoon Kim, Suwon-si (KR); Sang Uk Son, Suwon-si (KR); Chang Hyun Lim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/388,979

(22) Filed: Apr. 19, 2019

(65) Prior Publication Data

US 2020/0252051 A1    Aug. 6, 2020

(30) Foreign Application Priority Data

Jan. 31, 2019 (KR) .......................... 10-2019-0012938

(51) Int. Cl.
*H03H 9/54* (2006.01)
*H03H 9/13* (2006.01)
*H03H 9/205* (2006.01)
*H03H 9/02* (2006.01)

(52) U.S. Cl.
CPC .......... *H03H 9/54* (2013.01); *H03H 9/02007* (2013.01); *H03H 9/13* (2013.01); *H03H 9/205* (2013.01)

(58) Field of Classification Search
CPC .............. H03H 9/02; H03H 9/13; H03H 9/54
See application file for complete search history.

(56) References Cited

U.S. PATENT DOCUMENTS

| | | | | |
|---|---|---|---|---|
| 6,839,946 B2* | 1/2005 | Ylilammi | ................. | H03H 3/02 29/25.35 |
| 7,501,739 B2* | 3/2009 | Itaya | ....................... | H03H 3/02 310/320 |
| 8,692,631 B2* | 4/2014 | Zhang | ..................... | H03H 3/04 29/25.35 |

(Continued)

FOREIGN PATENT DOCUMENTS

KR      10-2005-0098714 A    10/2005
KR         10-1130145 B1      3/2012
(Continued)

OTHER PUBLICATIONS

Taiwanese Office Action dated Oct. 29, 2020 in counterpart Taiwanese Patent Application No. 108139608 (4 pages in English and 3 pages in Mandarin Chinese).

*Primary Examiner* — Dean O Takaoka
*Assistant Examiner* — Alan Wong
(74) *Attorney, Agent, or Firm* — NSIP Law

(57) ABSTRACT

A bulk-acoustic wave resonator includes a substrate; a membrane layer forming a cavity with the substrate; a first electrode at least partially disposed on an upper portion of the cavity including an end portion that is thicker than other portions of the first electrode; an insertion layer including a first portion disposed adjacent to from the end portion of the first electrode and a second portion disposed on an upper portion of the first electrode; a piezoelectric layer disposed to cover the insertion layer; and a second electrode disposed on an upper portion of the piezoelectric layer.

18 Claims, 9 Drawing Sheets

(56) References Cited

U.S. PATENT DOCUMENTS

| | | | |
|---|---|---|---|
| 8,902,023 B2* | 12/2014 | Choy | ................ H03H 9/02118 |
| | | | 333/187 |
| 9,148,117 B2* | 9/2015 | Burak | ...................... H03H 3/04 |
| 9,490,771 B2* | 11/2016 | Burak | ................... H03H 9/173 |
| 10,615,776 B2* | 4/2020 | Ishida | ............... H03H 9/02118 |
| 10,715,098 B2* | 7/2020 | Lee | ................... H03H 9/02118 |
| 2011/0084779 A1 | 4/2011 | Zhang | |
| 2015/0244347 A1 | 8/2015 | Feng et al. | |
| 2018/0254764 A1 | 9/2018 | Lee et al. | |

FOREIGN PATENT DOCUMENTS

| | | |
|---|---|---|
| KR | 10-2015-0101959 A | 9/2015 |
| KR | 10-2007443 B1 | 8/2019 |
| WO | WO 2005/034345 A1 | 4/2005 |

* cited by examiner

BULK-ACOUSTIC WAVE RESONATOR

CROSS-REFERENCE TO RELATED APPLICATION

This application claims the benefit under 35 U.S.C. § 119(a) of Korean Patent Application No. 10-2019-0012938 filed on Jan. 31, 2019 in the Korean Intellectual Property Office, the entire disclosure of which is incorporated herein by reference for all purposes.

BACKGROUND

1. Field

The following description relates to a bulk-acoustic wave resonator.

2. Description of Background

A bulk-acoustic wave (BAW) filter is a key element of a radio frequency (RF) module which passes a desired frequency band and blocks an undesired frequency band of a RF signal in a Front End Module (of a device) such as a smartphone, a tablet, and the like. As the mobile market is growing, demand therefor is gradually increasing.

The BAW filter is composed of bulk-acoustic wave resonators. When Q performance of the bulk-acoustic wave resonator is good, only a desired band may be selected in the BAW filter.

To improve the Q performance of a half-resonance point in the bulk-acoustic wave resonator, a frame is formed around an active area of the resonator, such that a lateral wave generated at the time of resonance would be reflected to an inside of the resonator to confine a resonant energy in the active area.

Generally, a frame is formed to be thicker than the active area by using the same material as an upper electrode. In this case, $kt^2$ performance may be deteriorated due to an inactive area occupied by the frame, and noise may occur due to frame resonance in a wide band area. To solve a problem of the frame, an eave-shaped structure may be used at an outer periphery of the resonator, but a process may become complicated, and thus, a yield may be deteriorated.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk-acoustic wave resonator includes: a substrate; a membrane layer forming a cavity with the substrate; a first electrode at least partially disposed on an upper portion of the cavity and including an end portion that is thicker than other portions of the first electrode; an insertion layer including a first portion disposed adjacent to from the end portion of the first electrode and a second portion disposed on an upper portion of the first electrode; a piezoelectric layer disposed to cover the insertion layer; and a second electrode disposed on an upper portion of the piezoelectric layer.

The end portion of the first electrode may include a protrusion portion having an increasing thickness.

The end portion of the first electrode may include an inclined portion having a decreasing thickness.

An upper surface of the first portion of the insertion layer may be coplanar with an upper surface of the end portion of the first electrode.

An upper surface of the first portion of the insertion layer may be disposed above an upper surface of the end portion of the first electrode.

One end of an upper surface of the first portion of the insertion layer may be coplanar with an upper surface of the end portion of the first electrode, and the other end of the upper surface of the first portion of the insertion layer may be disposed below the upper surface of the end portion of the first electrode.

An upper surface of the first portion of the insertion layer may be disposed below an upper surface of the end portion of the first electrode.

The inclined portion may extend from the protrusion portion.

The bulk-acoustic wave resonator may include an etch stop portion disposed between the substrate and the first electrode and disposed around the cavity.

The bulk-acoustic wave resonator may include a sacrificial layer disposed outside the etch stop portion.

The bulk-acoustic wave resonator may include a passivation layer disposed on the second electrode.

The insertion layer may include an insulator material.

The insertion layer may include any one of silicon oxide (SiO2), aluminum nitride (AlN), aluminum oxide (Al2O3), silicon nitride (Si3N4), manganese oxide (MgO), zirconium oxide (ZrO2), lead zirconate titanate (PZT), gallium arsenide (GaAs), hafnium oxide (HfO2), aluminum oxide (Al2O3), titanium oxide (TiO2), and zinc oxide (ZnO).

The insertion layer may be disposed outside a flat portion of the piezoelectric layer.

The first electrode may include any one of molybdenum (Mo), ruthenium (Ru), tungsten (W), iridiym (Ir), platinum (Pt), copper (Cu), titanum (Ti), tantalum (Ta), nickel (Ni) and chromium (Cr) or an alloy containing any one of molybdenum (Mo), ruthenium (Ru), tungsten (W), iridiym (Ir), platinium (Pt), copper (Cu), titanium (Ti), tantalum (Ta), nickel (Ni), and chromium (Cr).

In another general aspect, a bulk-acoustic wave resonator includes: a substrate; a first electrode disposed on an upper portion of the substrate; an insertion layer including a portion disposed to extend from the first electrode; a piezoelectric layer disposed to cover the insertion layer; and a second electrode disposed on an upper portion of the piezoelectric layer. The first electrode includes a protrusion portion having an inclined upper surface and an inclined portion extending from the protrusion portion and having a reduced thickness toward an end of the first electrode. The portion of the insertion layer disposed to extend from the first electrode covers the inclined portion.

The first electrode may include a material having a high acoustic impedance value, and the insertion layer may include a material having a low acoustic impedance value.

In another general aspect, a bulk-acoustic wave resonator includes a substrate; a first electrode disposed on the substrate and including an end portion having a variable height with respect to an upper surface of the substrate; an insertion layer including a portion disposed to extend from the end portion the first electrode; a piezoelectric layer disposed on the insertion layer; and a second electrode disposed on the piezoelectric layer.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
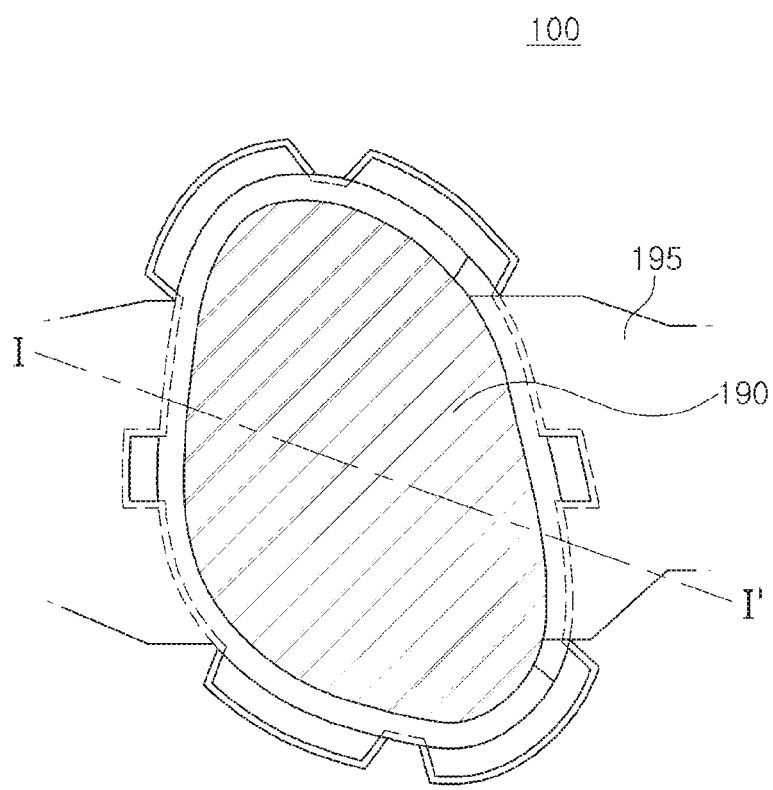
FIG. 1 is a schematic plan view illustrating a bulk-acoustic wave resonator according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Hereinafter, examples will be described in detail with reference to the accompanying drawings.

Figure 2:
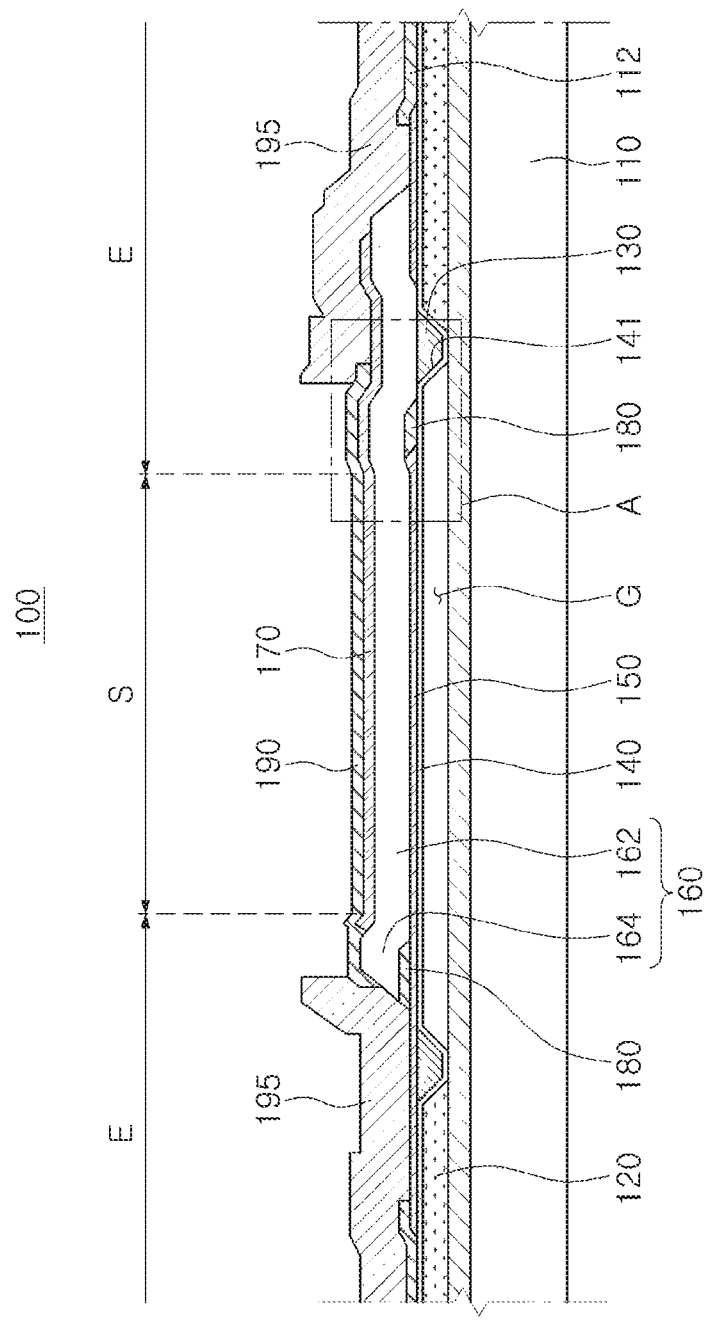
FIG. 2 is a cross-sectional view taken along the line I-I' of FIG. 1.
Figure 3:
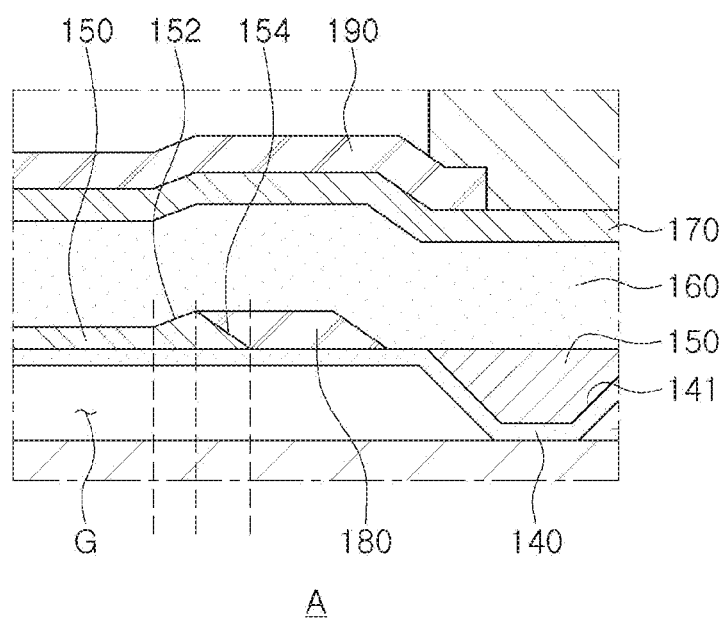
FIG. 3 is an enlarged view illustrating portion A of FIG. 2.

FIG. 1 is a schematic plan view illustrating a bulk-acoustic resonator according to an example, FIG. 2 is a cross-sectional view taken along the line I-I' of FIG. 2, and FIG. 3 is an enlarged view illustrating portion A of FIG. 2.

Referring to FIGS. 1, 2, and 3, a bulk-acoustic wave resonator 100 may include a substrate 110, a sacrificial layer 120, an etch stop portion 130, a membrane layer 140, a first electrode 150, a piezoelectric layer 160, a second electrode 170, an insertion layer 180, a passivation layer 190 and a metal pad 195.

The substrate 110 may be a silicon substrate. For example, a silicon wafer may be used as the substrate 110, or a silicon on insulator (SOI) type substrate may be used as the substrate 110.

An insulating layer 112 may be formed on an upper surface of the substrate 110, and the substrate 110 may be electrically isolated from a configuration disposed thereabove. The insulating layer 112 may serve to prevent the substrate 110 from being etched by an etching gas when a cavity G is formed during a manufacturing process.

The insulating layer 112 may be formed of at least one of silicon dioxide (SiO2), silicon nitride (Si3N4), aluminum oxide (Al2O3), and aluminum nitride (AlN), and the insulating layer 112 may be formed through a process of chemical vapor deposition, RF magnetron sputtering or evaporation.

The sacrificial layer 120 may be formed on the insulating layer 112, and the cavity G and the etch stop portion 130 may be disposed inside the sacrificial layer 120. The cavity G may be formed by removing a portion of the sacrificial layer 120 during manufacturing. As described above, as the cavity G is formed inside the sacrificial layer 120, the first electrode 150, and the like, disposed on an upper portion of the sacrificial layer 120 may be formed to be flat.

The etch stop portion 130 may be disposed along a boundary of the cavity G. The etch stop portion 130 may prevent etching from progressing beyond a cavity area in a process of forming the cavity G.

The membrane layer 140 may form the cavity G with the substrate 110. The membrane layer 140 may be formed of a material having a low reactivity with an etching gas when the sacrificial layer 120 is removed. The etch stop portion 130 may be inserted into and disposed in a groove portion 141 formed by the membrane layer 140. The membrane layer 140 may be a dielectric layer containing any one of silicon nitride (Si3N4), silicon oxide (SiO2), manganese oxide (MgO), zirconium oxide (ZrO2), aluminum nitride (AlN), lead zirconate titanate (PZT), gallium arsenide (GaAs), hafnium oxide (HfO2), aluminum oxide (Al2O3), titanium oxide (TiO2), and zinc oxide (ZnO).

A seed layer (not illustrated) made of aluminum nitride (AlN) may be formed on the membrane layer 140. That is, the seed layer may be disposed between the membrane layer 140 and the first electrode 150. The seed layer (not illustrated) may be formed using a dielectric or a metal having an HCP crystal structure in addition to aluminum nitride (AlN). For example, when the seed layer is a metal, the seed layer may be formed of titanium (Ti).

The first electrode 150 may be formed on the membrane layer 140, and a portion of the first electrode 150 may be disposed on an upper portion of the cavity G. The first electrode 150 may be used as any one of an input electrode or an output electrode for inputting and outputting an electric signal such as a radio frequency (RF) signal, or the like.

As an example, the first electrode 150 may be formed using a conductive material such as molybdenum (Mo) or alloys thereof. However, the configuration of the first electrode 150 is not limited thereto, and the first electrode 150 may be formed of a conductive material such as ruthenium (Ru), tungsten (W), iridium (Ir), platinum (Pt), copper (Cu), titanium (Ti), tantalum (Ta), nickel (Ni), chromium (Cr), and the like or alloys thereof.

The first electrode 150 may include a protrusion portion 152 disposed adjacent to the insertion layer 180, and the protrusion portion may be formed to be thicker than other portions of the first electrode 150, as illustrated in more detail in FIG. 3. The protrusion portion 152 may become thicker toward the end portion of the first electrode 150. As an example, an upper surface of the protrusion portion 152 may be formed to be inclined. Since the first electrode 150 is provided with the protrusion portion 152, the piezoelectric layer 160, the second electrode 170 and the passivation layer 190, which are disposed on an upper portion of the protrusion portion 152, may be raised upwardly. The first electrode 150 may be provided with an inclined portion 154, and the inclined portion is connected to the protrusion portion 152 and gradually decreases in thickness.

By adjusting a width of the protrusion portion 152 of the first electrode 150 and the inclined portion 154 of the first electrode 150 in consideration of a wavelength of a lateral wave, reflection efficiency with regard to the lateral wave may be increased.

As an example, the width w of the protrusion portion 152 and the inclined portion 154 may be designed in accordance with the following equation.

$$w = n*\lambda/4 \ (n=1,3,5,\ldots)$$

In this equation, $\lambda$ represents the wavelength of the lateral wave.

The piezoelectric layer 160 may be formed to at least cover the first electrode 150 disposed on an upper portion of the cavity G. The piezoelectric layer 160 may cause a piezoelectric effect converting electrical energy into a mechanical energy in a form of elastic waves. The piezoelectric layer 160 may be formed of one of aluminum nitride (AlN), zinc oxide (ZnO), and lead zirconium titanium oxide (PZT; PbZrTiO). When the piezoelectric layer 160 is formed of aluminum nitride (AlN), the piezoelectric layer 160 may further include a rare earth metal. For example, the rare earth metal may include at least one of scandium (Sc), erbium (Er), yttrium (Y), and lanthanum (La). In addition, for example, a transition metal may include at least one of titanium (Ti), zirconium (Zr), hafnium (Hf), tantalum (Ta), and niobium (Nb). Magnesium (Mg), which is a divalent metal, may also be included in the piezoelectric layer 160.

The piezoelectric layer 160 may include a piezoelectric portion 162 disposed in a flat portion S of the bulk-acoustic wave resonator 100 and a bent portion 164 disposed in an extension portion E bulk-acoustic wave resonator 100.

The piezoelectric portion 162 may be a portion directly stacked on an upper portion of the first electrode 150. Therefore, the piezoelectric portion 162 may be disposed between the first electrode 150 and the second electrode 170 in a flat form with the first electrode 150 and the second electrode 170.

The bent portion 164 may be defined as an area extending outwardly from the piezoelectric portion 162 to be located in the extension portion E.

The bent portion 164 may be disposed on the insertion layer 180, and may have a shape corresponding to the shape of the insertion layer 180. The piezoelectric layer 160 may be bent at a boundary between the piezoelectric portion 162 and the bent portion 164, and the bent portion 164 may be raised by an amount corresponding to the thickness and the shape of the insertion layer 180.

The second electrode 170 may be disposed in an upper portion of the piezoelectric layer 160. For example, the second electrode 170 may be formed to at least cover the piezoelectric layer 160 disposed on an upper portion of the cavity G. The second electrode 170 may be used as any one of an input electrode and an output electrode for inputting and outputting an electrical signal such as a radio frequency (RF) signal, or the like. When the first electrode 150 is used as an input electrode, the second electrode 170 may be used as an output electrode. When the first electrode 150 is used as an output electrode, the second electrode 170 may be used as an input electrode.

The second electrode 170 may be formed using a conductive material such as molybdenum (Mo) or alloys thereof. However, the configuration of the second electrode 170 is not limited thereto, and the second electrode 170 may be formed of a conductive material such as ruthenium (Ru), tungsten (W), iridium (Ir), platinum (Pt), copper (Cu), titanium (Ti), tantalum (Ta), nickel (Ni), chromium (Cr), and the like or alloys thereof.

The insertion layer 180 may be disposed such that a portion thereof extends from the first electrode 150, and a remaining portion thereof may be disposed on an upper portion of the first electrode 150. The insertion layer 180 may be formed of a dielectric such as silicon oxide (SiO2), aluminum nitride (AlN), aluminum oxide (Al2O3), silicon nitride (Si3N4), manganese oxide (MgO), zirconium oxide (ZrO2), lead zirconate titanate (PZT), gallium arsenide (GaAs), hafnium oxide (HfO2), aluminum oxide (Al2O3), titanium oxide (TiO2), zinc oxide (ZnO), and the like, but may be formed of a material different from material of which the piezoelectric layer 160 is formed.

An upper surface of a portion of the insertion layer 180 may be disposed in parallel to (coplanar with) an upper surface of the end of the protrusion portion 152, as illustrated in more detail in FIG. 3. That is, the upper surface of the portion of the insertion layer 180 may be disposed in parallel to (coplanar with) the upper surface of the end of the protrusion portion 152.

The insertion layer 180 may be disposed in an area of the bulk-acoustic wave resonator 100 other than the flat portion S. For example, the insertion layer 180 may be disposed over an entire area except for the flat portion S, or may be disposed in a partial area.

A portion of the insertion layer 180 may be disposed to overlap the inclined portion 154 of the first electrode 150. However, a portion of the insertion layer 180 may be disposed so as to not overlap the protrusion portion 152.

The first electrode 150 may include a material having a high acoustic impedance value, and the insertion layer 180 may include a material having a low acoustic impedance value, such that reflection efficiency may be increased.

The passivation layer 190 may serve to prevent damage to the second electrode 170 and the first electrode 150 during the process.

The passivation layer 190 may be partially removed by etching for controlling a frequency in a final process. That is, the thickness of the passivation layer 190 may be adjusted. In the passivation layer 190, for example, a dielectric layer containing any one of silicon nitride (Si3N4), silicon oxide (SiO2), manganese oxide (MgO), zirconium oxide (ZrO2), aluminum nitride (AlN), lead zirconate titanate (PZT), gallium arsenide (GaAs), hafnium oxide (HfO2), aluminum oxide (Al2O3), titanium oxide (TiO2), and zinc oxide (ZnO) may be used.

The metal pad 195 may be formed on one portion of the first electrode 150 and the second electrode 170 in which the passivation layer 190 is not formed. As an example, the metal pad 195 may be made of a material such as gold (Au), a gold-tin (Au—Sn) alloy, copper (Cu), a copper-tin (Cu—Sn) alloy, aluminum (Al), an aluminum alloy, and the like. For example, the aluminum alloy may be an aluminum-germanium (Al—Ge) alloy.

The first electrode 150 may include a material having a high acoustic impedance value, and the insertion layer 180 may include a material having a low acoustic impedance value, such that the reflection efficiency may be increased. A width of the protrusion portion 152 of the first electrode 150 and a width of the inclined portion 154 of the first electrode 150 may be adjusted in consideration of the wavelength of the lateral wave, such that the reflection efficiency to the lateral wave may be increased.

Hereinafter, another example of the bulk-acoustic wave resonator will be described with reference to the drawings. However, the same components as those described above are denoted by the same reference numerals as used above, and a detailed description thereof will be omitted.

Figure 4:
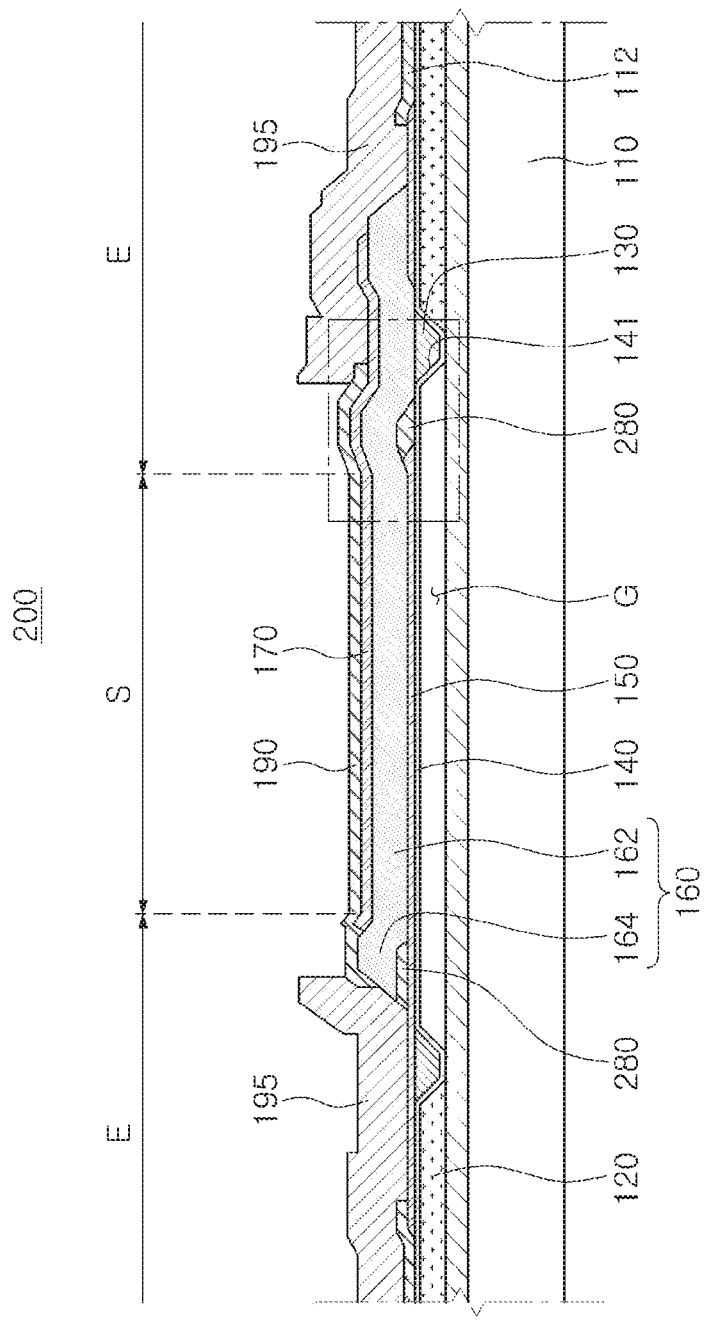
FIG. 4 is a schematic cross-sectional view illustrating a bulk-acoustic wave resonator according to an example.
Figure 5:
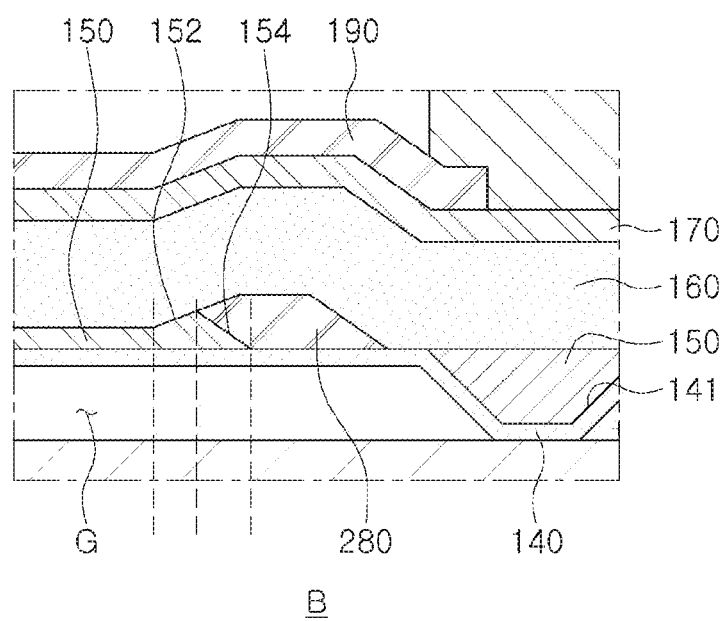
FIG. 5 is an enlarged view illustrating portion B of FIG. 4.

FIG. 4 is a schematic cross-sectional view illustrating a bulk-acoustic wave resonator according to a second example, and FIG. 5 is an enlarged view illustrating portion B of FIG. 4.

Referring to FIGS. 4 and 5, a bulk-acoustic wave resonator 200 may include a substrate 110, a sacrificial layer 120, an etch stop portion 130, a membrane layer 140, a first electrode 150, a piezoelectric layer 160, a second electrode 170, an insertion layer 280, a passivation layer 190 and a metal pad 195.

The insertion layer 280 may be disposed such that a portion thereof extends from the first electrode 150, and a remaining portion of the insertion layer 280 may be disposed on an upper portion of the first electrode 150. The insertion layer 280 may be formed of a dielectric such as silicon oxide (SiO2), aluminum nitride (AlN), aluminum oxide (Al2O3), silicon nitride (Si3N4), manganese oxide (MgO), zirconium oxide (ZrO2), titanic acid zirconate (PZT), gallium arsenic (GaAs), hafnium oxide (HfO2), aluminum oxide (Al2O3), titanium oxide (TiO2), zinc oxide (ZnO), and the like, but may be formed of a material different from a material of which the piezoelectric layer 160 is formed.

An upper surface of a portion of the insertion layer 280 may be disposed on a portion above an upper surface of the end of the protrusion portion 152 of the first electrode, as illustrated in more detail in FIG. 5. That is, the upper surface of the portion of the insertion layer 280, disposed to extend from the first electrode 150, may be disposed higher than the upper surface of the end of the protrusion portion 152. The end portion of the insertion layer 280 may have a thickness, thicker than that of the protrusion portion 152 of the first electrode 150.

The insertion layer 280 may be disposed in an area excluding the flat portion S. For example, the insertion layer 280 may be disposed over an entire area except for the flat portion S, or may be disposed in a partial area.

The insertion layer 280 may be disposed such that at least a portion of the insertion layer 280 overlaps the inclined portion 154 of the first electrode 150. However, the insertion layer 280 may be disposed to not overlap the protrusion portion 152.

The first electrode 150 may include a material having a high acoustic impedance value, and the insertion layer 280 may include a material having a low acoustic impedance value, such that the reflection efficiency may be increased. The width of the protrusion portion 152 of the first electrode 150 and the width of the inclined portion 154 of the first electrode 150 may be adjusted in consideration of the wavelength of the lateral wave, such that the reflection efficiency to the lateral wave may be increased.

Figure 6:
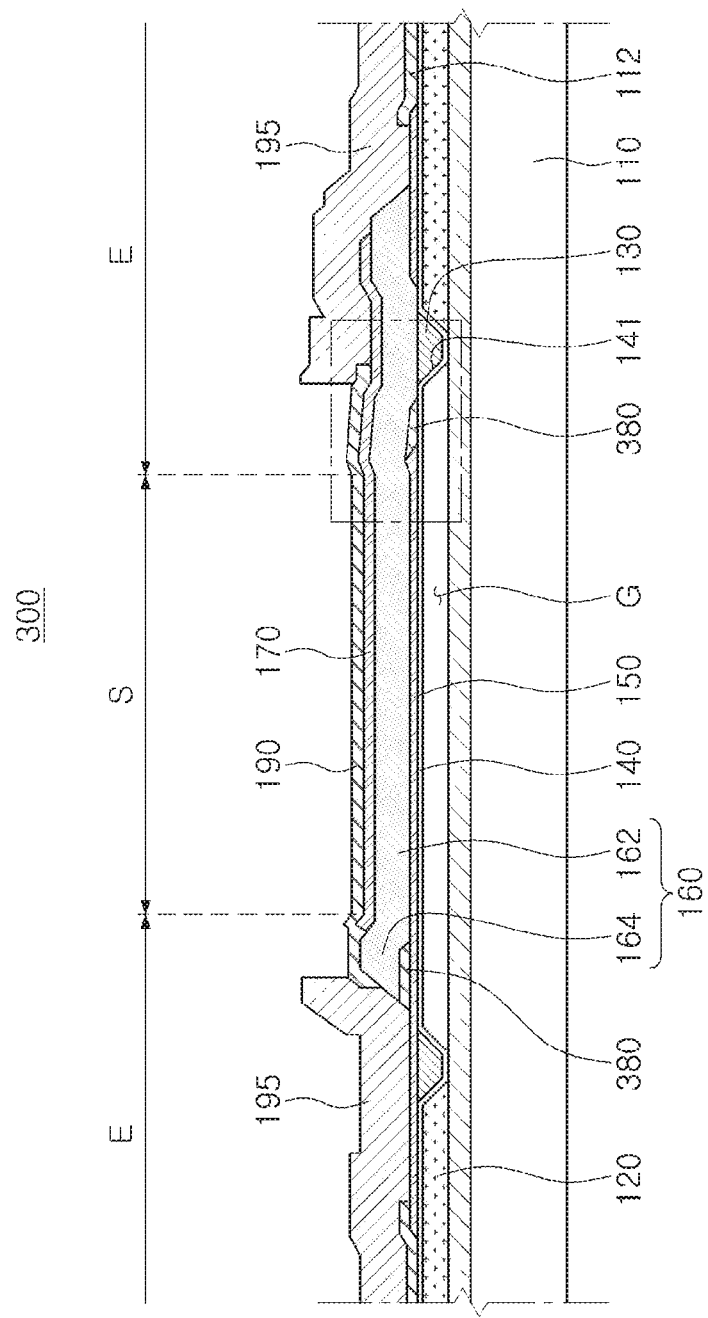
FIG. 6 is a schematic cross-sectional view illustrating a bulk-acoustic wave resonator according to an example.
Figure 7:
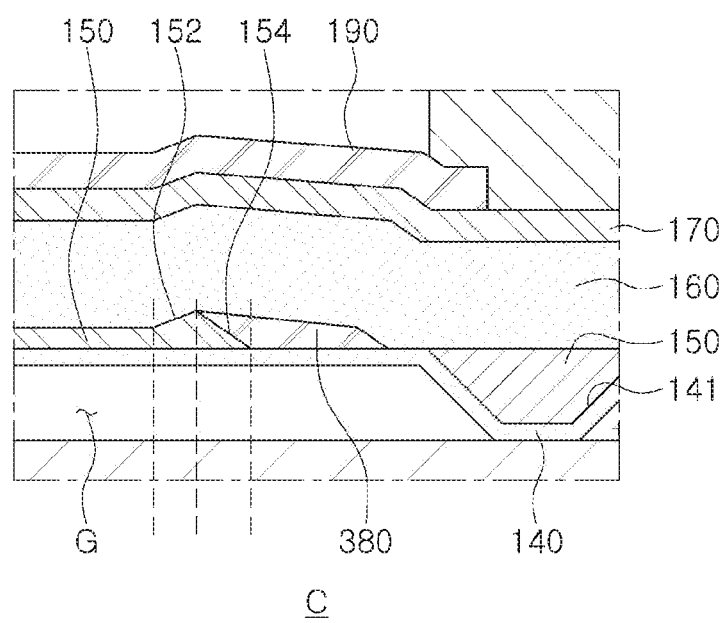
FIG. 7 is an enlarged view illustrating portion C of FIG. 6.

FIG. 6 is a schematic cross-sectional view illustrating a bulk-acoustic wave resonator according to a third example, and FIG. 7 is an enlarged view illustrating portion C of FIG. 6.

Referring to FIGS. 6 and 7, a bulk-acoustic wave resonator 300 may include a substrate 110, a sacrificial layer 120, an etch stop portion 130, a membrane layer 140, a first electrode 150, a piezoelectric layer 160, a second electrode 170, an insertion layer 380, a passivation layer 190 and a metal pad 195.

The insertion layer 380 may be disposed such that a portion thereof extends from the first electrode 150 and a remaining portion of the insertion layer is disposed on an upper portion of the first electrode 150. The insertion layer 380 may be formed of a dielectric such as silicon oxide (SiO2), aluminum nitride (AlN), aluminum oxide (Al2O3), silicon nitride (Si3N4), manganese oxide (MgO), zirconium oxide (ZrO2), titanic acid zirconate (PZT), gallium arsenic (GaAs), hafnium oxide (HfO2), aluminum oxide (Al2O3), titanium oxide (TiO2), zinc oxide (ZnO), and the like, but may be formed of a material different from a material of which the piezoelectric layer 160 is formed.

As illustrated in more detail, in FIG. 7, one end of an upper surface of the portion of the insertion layer 380 that extends from the first electrode may be at a same height as an upper surface of the end of the protrusion portion 152, and the other end of an upper surface of the insertion layer 380 may be disposed a portion below the upper surface of the end of the protrusion portion 152. That is, the one end of the upper surface of the portion of the insertion layer 380 disposed to extend from the first electrode 150 may be the same as the upper surface of the end of the protrusion portion 152, and the other end of the upper surface of the portion of the insertion layer 380 may be disposed below the upper surface of the end of the protrusion portion 152. In other words, the insertion layer 380 may be thinner than the protrusion portion 152 of the first electrode 150.

The insertion layer 380 may be disposed in an area excluding the flat portion S. For example, the insertion layer 380 may be disposed over an entire area except for the flat portion S, or may be disposed in a partial area.

The insertion layer 380 may be disposed such that at least a portion of the insertion layer 380 overlaps the inclined portion 154 of the first electrode 150. However, the insertion layer 380 may be disposed to not overlap the protrusion portion 152.

The first electrode 150 may include a material having a high acoustic impedance value, and the insertion layer 380 may include a material having a low acoustic impedance value, such that the reflection efficiency may be increased. The width of the protrusion portion 152 of the first electrode 150 and the width of the inclined portion 154 of the first electrode 150 may be adjusted in consideration of the wavelength of the lateral wave, such that the reflection efficiency to the lateral wave may be increased.

Figure 8:
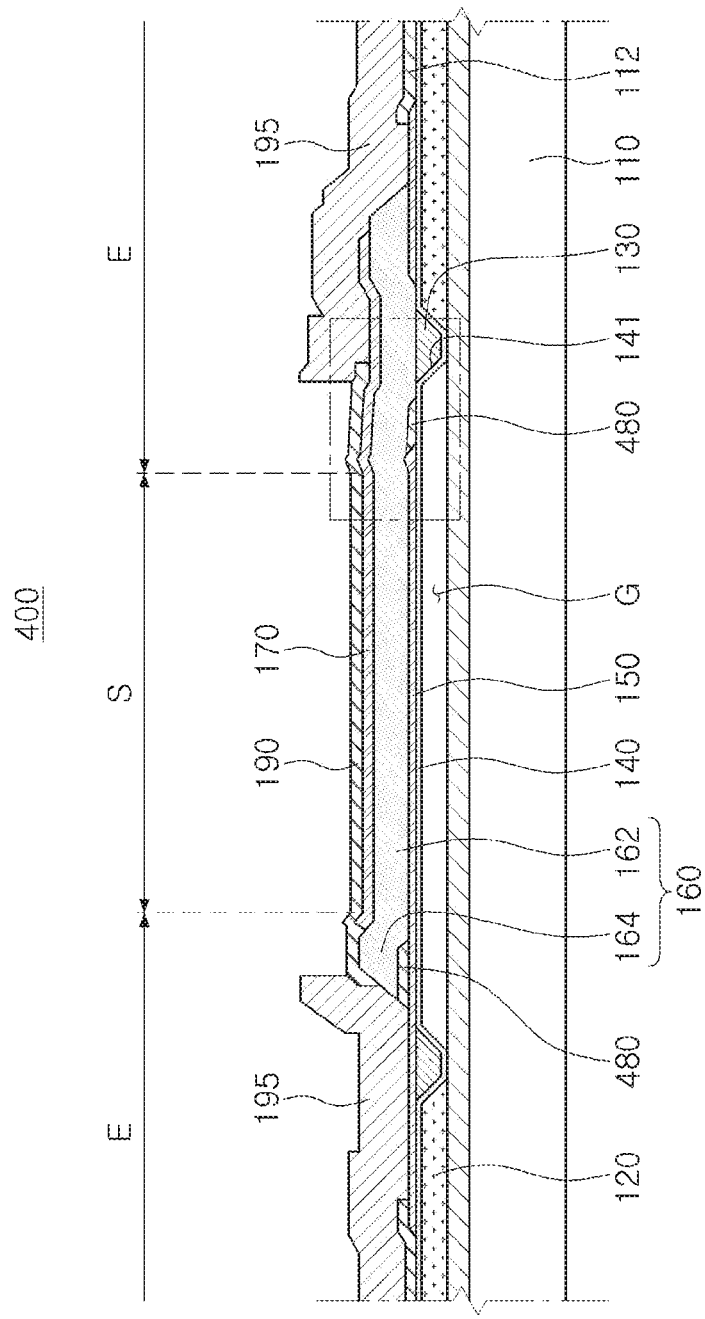
FIG. 8 is a schematic cross-sectional view illustrating a bulk-acoustic wave resonator according to an example.
Figure 9:
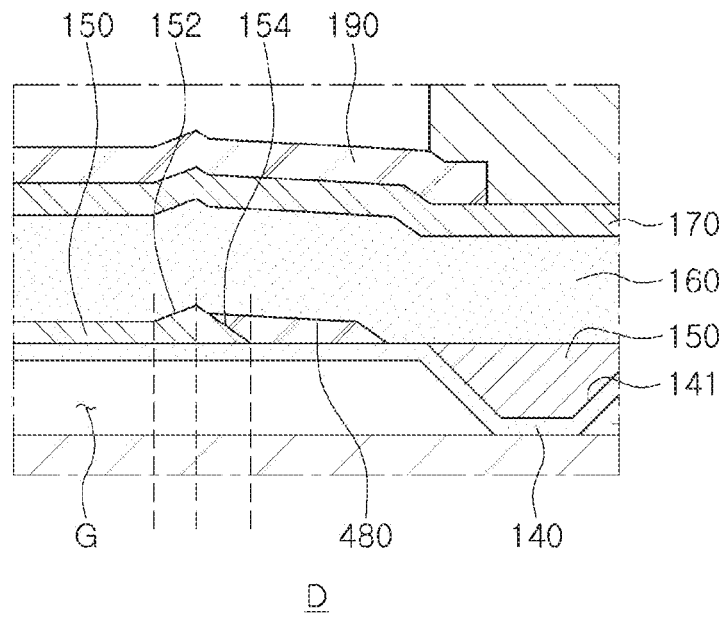
FIG. 9 is an enlarged view illustrating portion D of FIG. 8.

FIG. 8 is a schematic cross-sectional view illustrating a bulk-acoustic wave resonator according to a fourth example, and FIG. 9 is an enlarged view illustrating portion D of FIG. 8.

Referring to FIGS. 8 and 9, a bulk-acoustic wave resonator 400 may include a substrate 110, a sacrificial layer 120, an etch stop portion 130, a membrane layer 140, a first electrode 140, a piezoelectric layer 160, a second electrode 170, an insertion layer 480, a passivation layer 190, and a metal pad 195.

The insertion layer 480 may be disposed such that a portion thereof extends from the first electrode 150, and a remaining portion of the insertion layer 480 may be disposed on an upper portion of the first electrode 150. The insertion layer 480 may be formed of a dielectric such as silicon oxide (SiO2), aluminum nitride (AlN), aluminum oxide (Al2O3), silicon nitride (Si3N4), manganese oxide (MgO), zirconium oxide (ZrO2), lead zirconate titanate (PZT), gallium arsenic (GaAs), hafnium oxide (HfO2), aluminum oxide (Al2O3), titanium oxide (TiO2), zinc oxide (ZnO), and the like, but may be formed of a material different from a material of which the piezoelectric layer 160 is formed.

As illustrated in more detail in FIG. 9, an upper surface of a portion of the insertion layer 480 may be disposed below an upper surface of the end of the protrusion portion 152 of the first electrode. That is, the upper surface of the portion of the insertion layer 480, disposed to extend from the first electrode 150, may be disposed below the upper surface of the end of the protrusion portion 152. In other words, the insertion layer 480 is thinner than the protrusion portion 152 of the first electrode 150.

The insertion layer 480 may be disposed in an area excluding the flat portion S. For example, the insertion layer 380 may be disposed over an entire area except for the flat portion S, or may be disposed in a partial area.

The insertion layer 480 may be disposed such that at least a portion of the insertion layer 480 overlaps the inclined portion 154 of the first electrode 150. However, the insertion layer 480 may be disposed to not overlap the protrusion portion 152.

The first electrode 150 may include a material having a high acoustic impedance value, and the insertion layer 480 may include a material having a low acoustic impedance value, such that the reflection efficiency may be increased. The width of the protrusion portion 152 of the first electrode 150 and the width of the inclined portion 154 of the first electrode 150 may be adjusted in consideration of the wavelength of the lateral wave, such that the reflection efficiency to the lateral wave may be increased.

Figure 10:
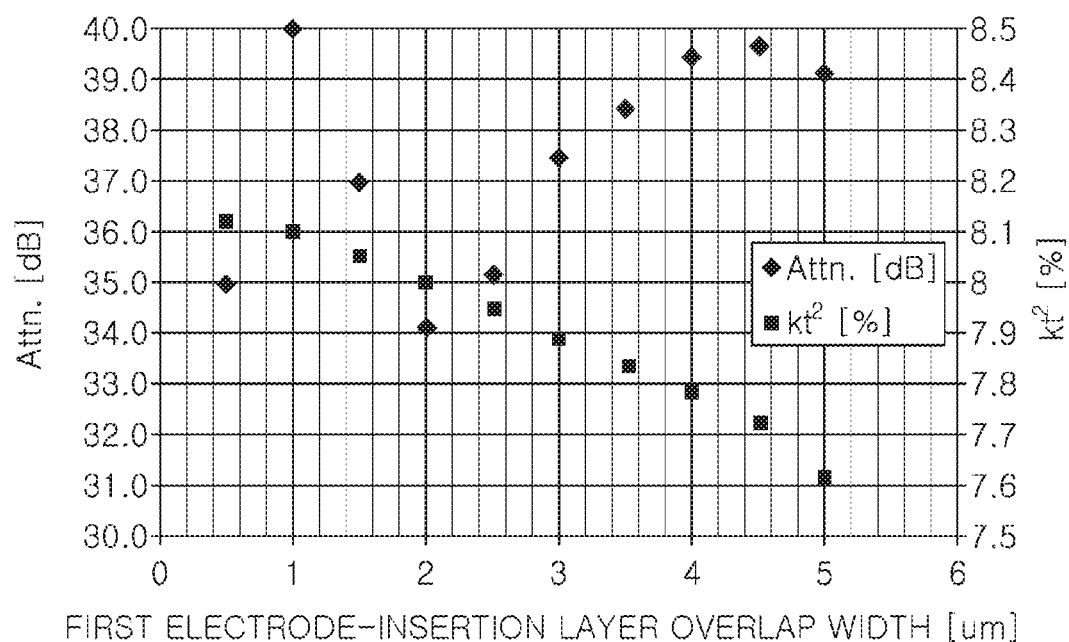
FIG. 10 is a graph illustrating an effect of a resonator due to a width overlapping a first electrode and an insertion layer.

FIG. 10 is a graph illustrating an effect of a resonator by a width overlapping a first electrode and an insertion layer.

Referring to FIG. 10, it can be seen that the best attenuation performance (Attn. performance) may be obtained while maintaining an overlapping width of a first electrode 150 (referring to FIG. 2) and an insertion layer 180 (referring to FIG. 2) a high $kt^2$ performance at 1 μm.

It can be seen that as the overlapping width of the first electrode 150 (referring to FIG. 2) and the insertion layer 180 (referring to FIG. 2) increases, the $kt^2$ performance gradually decreases. In addition, it can be seen that the attenuation performance (Attn. performance) increases when the overlapping width of the first electrode 150 (referring to FIG. 2) and the insertion layer 180 (referring to FIG. 2) is greater than 2.5 μm.

When considering an experimental condition, of FIG. 10, a resonance frequency is in 2.0 GHz, and the first electrode 150 may be made of a molybdenum (Mo) material and a thickness thereof is 2800 Å. The piezoelectric layer 160 (referring to FIG. 2) may be made of an aluminum nitride (AlN) material and a thickness thereof is 11000 Å, and the second electrode 170 (referring to FIG. 2) may be made of a molybdenum (Mo) and a thickness thereof is 2600 Å.

As set forth above, the $kt^2$ performance may be improved, and the reflection performance may be improved.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk-acoustic wave resonator comprising:
a substrate;
a membrane layer forming a cavity with the substrate;
a first electrode at least partially disposed on an upper portion of the cavity and comprising an end portion that is thicker than other portions of the first electrode;
an insertion layer comprising a first portion disposed adjacent to the end portion of the first electrode and a second portion disposed on an upper portion of the first electrode;
a piezoelectric layer disposed to cover the insertion layer; and
a second electrode disposed on an upper portion of the piezoelectric layer.

2. The bulk-acoustic wave resonator of claim 1, wherein the end portion of the first electrode comprises a protrusion portion having an increasing thickness.

3. The bulk-acoustic wave resonator of claim 2, wherein the end portion of the first electrode comprises an inclined portion having a decreasing thickness.

4. The bulk-acoustic wave resonator of claim 3, wherein an upper surface of the first portion of the insertion layer is coplanar with an upper surface of the end portion of the first electrode.

5. The bulk-acoustic wave resonator of claim 3, wherein an upper surface of the first portion of the insertion layer is disposed above an upper surface of the end portion of the first electrode.

6. The bulk-acoustic wave resonator of claim 3, wherein one end of an upper surface of the first portion of the insertion layer is coplanar with an upper surface of the end portion of the first electrode, and the other end of the upper surface of the first portion of the insertion layer is disposed below the upper surface of the end portion of the first electrode.

7. The bulk-acoustic wave resonator of claim 3, wherein an upper surface of the first portion of the insertion layer is disposed below an upper surface of the end portion of the first electrode.

8. The bulk-acoustic wave resonator of claim 3, wherein the inclined portion extends from the protrusion portion.

9. The bulk-acoustic wave resonator of claim 1, further comprising an etch stop portion disposed between the substrate and the first electrode and disposed around the cavity.

10. The bulk-acoustic wave resonator of claim 9, further comprising a sacrificial layer disposed outside the etch stop portion.

11. The bulk-acoustic wave resonator of claim 1, further comprising a passivation layer disposed on the second electrode.

12. The bulk-acoustic wave resonator of claim 1, wherein the insertion layer comprises an insulator material.

13. The bulk-acoustic wave resonator of claim 12, wherein the insertion layer comprises any one of silicon oxide (SiO2), aluminum nitride (AlN), aluminum oxide (Al2O3), silicon nitride (Si3N4), manganese oxide (MgO), zirconium oxide (ZrO2), lead zirconate titanate (PZT), gallium arsenide (GaAs), hafnium oxide (HfO2), aluminum oxide (Al2O3), titanium oxide (TiO2), and zinc oxide (ZnO).

14. The bulk-acoustic wave resonator of claim 1, wherein the insertion layer is disposed outside a flat portion of the piezoelectric layer.

15. The bulk-acoustic wave resonator of claim 1, wherein the first electrode comprises any one of molybdenum (Mo), ruthenium (Ru), tungsten (W), iridiym (Ir), platinum (Pt), copper (Cu), titanium (Ti), tantalum (Ta), nickel (Ni) and chromium (Cr) or an alloy containing any one of molybdenum (Mo), ruthenium (Ru), tungsten (W), iridiym (Ir), platinium (Pt), copper (Cu), titanium (Ti), tantalum (Ta), nickel (Ni), and chromium (Cr).

16. A bulk-acoustic wave resonator comprising:
a substrate;
a first electrode disposed on an upper portion of the substrate;
an insertion layer comprising a portion disposed to extend from the first electrode;
a piezoelectric layer disposed to cover the insertion layer; and
a second electrode disposed on an upper portion of the piezoelectric layer,
wherein the first electrode comprises a protrusion portion having an inclined upper surface and an inclined portion extending from the protrusion portion and having a reduced thickness toward an end of the first electrode, and
the portion of the insertion layer disposed to extend from the first electrode covers the inclined portion.

17. The bulk-acoustic wave resonator of claim 16, wherein the first electrode comprises a material having a high acoustic impedance value, and the insertion layer comprises a material having a low acoustic impedance value.

18. A bulk-acoustic wave resonator comprising:
a substrate;
a first electrode disposed on the substrate;
an insertion layer comprising a portion disposed to extend from an end portion of the first electrode;
a piezoelectric layer disposed on the insertion layer; and
a second electrode disposed on the piezoelectric layer,
wherein the first electrode comprises a protrusion portion disposed adjacent to the insertion layer, and the protrusion portion is thicker than other portions of the first electrode.

* * * * *